United States Patent
Marty et al.

(10) Patent No.: US 9,450,000 B2
(45) Date of Patent: Sep. 20, 2016

(54) PHOTODIODE OF HIGH QUANTUM EFFICIENCY

(71) Applicants: STMicroelectronics (Crolles 2) SAS, Crolles (FR); STMicroelectronics SA, Montrouge (FR); Commissariat A L'Energie Atomique et aux Energies Alternatives, Paris (FR)

(72) Inventors: Michel Marty, Varces (FR); Sebastien Jouan, Crolles (FR); Laurent Frey, Grenoble (FR); Salim Boutami, Grenoble (FR)

(73) Assignees: STMicroelectronics (Crolles 2) SAS, Crolles (FR); STMicroelectronics SA, Montrouge (FR); Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/462,724

(22) Filed: Aug. 19, 2014

(65) Prior Publication Data
US 2015/0054042 A1    Feb. 26, 2015

(30) Foreign Application Priority Data
Aug. 23, 2013  (FR) .................................... 13 58138

(51) Int. Cl.
*H01L 31/062*  (2012.01)
*H01L 27/144*  (2006.01)
(Continued)

(52) U.S. Cl.
CPC ..... *H01L 27/1443* (2013.01); *H01L 27/14625* (2013.01); *H01L 27/14643* (2013.01);
(Continued)

(58) Field of Classification Search
CPC .................... H01L 27/1443; H01L 27/14625; H01L 27/14643; H01L 27/14689; H01L 29/16; H01L 29/4916; H01L 29/6656
USPC ......................................................... 257/292
See application file for complete search history.

(56) References Cited

U.S. PATENT DOCUMENTS

| | | |
|---|---|---|
| 5,656,835 A | 8/1997 | Komobuchi |
| 2006/0006485 A1 | 1/2006 | Mouli |

(Continued)

FOREIGN PATENT DOCUMENTS

| | | |
|---|---|---|
| EP | 2144303 A1 | 1/2010 |
| EP | 2477231 A2 | 7/2012 |

(Continued)

OTHER PUBLICATIONS

INPI Search Report and Written Opinion for FR1358138 mailed Jun. 16, 2014 (7 pages).

(Continued)

*Primary Examiner* — Matthew Gordon
(74) *Attorney, Agent, or Firm* — Gardere Wynne Sewell LLP

(57) ABSTRACT

A photodiode includes at least one central pad arranged on a light-receiving surface of a photodiode semiconductor substrate. The pad is made of a first material and includes lateral sidewalls surrounded by a spacer made of a second material having a different optical index than the first material. The lateral dimensions of the pad are smaller than an operating wavelength of the photodiode. Both the first and second materials are transparent to that operating wavelength. The pads and spacers are formed at a same time gate electrodes and sidewall spacers of MOS transistors are formed.

13 Claims, 4 Drawing Sheets

(51) Int. Cl.
  *H01L 31/0232* (2014.01)
  *H01L 27/146* (2006.01)
  *H01L 31/107* (2006.01)
  *H01L 29/16* (2006.01)
  *H01L 29/49* (2006.01)
  *H01L 29/66* (2006.01)
  *H01L 31/101* (2006.01)
  *H01L 31/18* (2006.01)

(52) U.S. Cl.
  CPC ......... *H01L27/14689* (2013.01); *H01L 29/16* (2013.01); *H01L 29/4916* (2013.01); *H01L 29/6656* (2013.01); *H01L 31/02327* (2013.01); *H01L 31/107* (2013.01); *H01L 31/1016* (2013.01); *H01L 31/1804* (2013.01)

(56) References Cited

U.S. PATENT DOCUMENTS

| | | |
|---|---|---|
| 2006/0012001 A1 | 1/2006 | Kim |
| 2008/0121781 A1 | 5/2008 | Boettiger |
| 2008/0170143 A1 | 7/2008 | Yoshida |
| 2009/0020690 A1 | 1/2009 | Toda |
| 2010/0122221 A1 | 5/2010 | Fertig et al. |
| 2011/0108939 A1 | 5/2011 | Marty et al. |
| 2011/0220976 A1 | 9/2011 | Iida et al. |
| 2011/0290982 A1 | 12/2011 | Boutami et al. |
| 2012/0267694 A1* | 10/2012 | Kaiser ............... H01L 27/14614 257/291 |
| 2013/0082286 A1* | 4/2013 | Finkelstein ......... H01L 31/0336 257/84 |
| 2013/0113964 A1 | 5/2013 | Sasaki et al. |

FOREIGN PATENT DOCUMENTS

| | | |
|---|---|---|
| KR | 20020045162 A | 6/2002 |
| WO | WO-2008027412 A2 | 3/2008 |
| WO | WO-2012032495 A1 | 3/2012 |

OTHER PUBLICATIONS

EP Search Report for co-pending EP 15182078.4 dated Dec. 9, 2015 (7 pages).

* cited by examiner

PHOTODIODE OF HIGH QUANTUM EFFICIENCY

PRIORITY CLAIM

This application claims the priority benefit of French Patent application number 1358138, filed on Aug. 23, 2013, the contents of which is hereby incorporated by reference in its entirety to the maximum extent allowable by law.

TECHNICAL FIELD

The present disclosure relates to semiconductor photodiodes, for example used as image sensor pixels or as single-photon photodiodes.

BACKGROUND

FIG. 1 partially and schematically shows two photodiodes side by side of a network of photodiodes, for example forming an image sensor. Each photodiode comprises a semiconductor area 1 for converting photons into electron-hole pairs. A complete photodiode comprises junctions (not shown) between semiconductor regions of opposite type to store photons, and various read transistors to transfer electrons.

PCT patent application WO2012/032495 (incorporated by reference) discloses that the introduction of light into the photodiode raises an issue when the lateral dimensions of the illuminated surface (the upper surface in FIG. 1) of a photodiode are very small, in the order of wavelength λ of the light that the photodiode is intended to capture, or operating wavelength. Thus, such photodiodes of very small dimensions have a low quantum efficiency. The PCT patent application provides, to increase the quantum efficiency of the photodiode, arranging on the upper surface thereof a pad 2 having lateral dimensions much smaller than the lateral dimensions of the photodiode.

FIG. 2 partially and schematically shows the detection portion of a single-photon avalanche diode, currently called SPAD. Such a diode comprises a structure formed of an N-type semiconductor layer 10 pinned between two semiconductor layers 12 and 13 of opposite type. The problem is that layer 10 is, in modern technologies, very thin, with a thickness which does not exceed from 1 to 1.5 µm. Layer 10 is where the useful conversion of photons into electron-hole pairs is to be performed, while it is known that, in the case of silicon and for an infrared radiation, the layer where the electron-hole pairs are to be created should have a thickness greater than 10 µm, to expect a photon conversion rate greater than 90%. Thus, the efficiency of a SPAD diode manufactured with current technologies does not exceed from 5 to 7%. To improve this efficiency and to avoid losing reflected light, upper semiconductor layer 12 has an antireflection structure, alternately comprising at least one layer of material of low index 14, for example, silicon oxide, and one layer of material of higher index 15, for example, silicon nitride, arranged thereon. Upper protection layer 16 currently is a silicon oxide layer.

Thus, a problem arises to absorb the maximum possible number of photons in structures with pixels of small dimensions such as shown in FIG. 1, and in structures where the layer of photon conversion into electron-hole pairs is particularly thin, such as the SPAD structure of FIG. 2. More generally, this problem arises more or less in all semiconductor photodiodes.

It should be noted that in photodiodes of very small dimensions or of SPAD type, an increase, even low, of the quantum efficiency or absorption rate of the useful portion of the photodiode is in practice extremely important for the detection of light of low intensity. Thus, an efficiency gain from 1 to 5% will be considered as a very significant gain by the user.

SUMMARY

Thus, an embodiment provides a photodiode comprising at least on central pad arranged on the light-receiving surface of the photodiode, the pad(s) being made of a first material having its lateral walls surrounded with at least one spacer made of a second material having a different optical index than the first material, the lateral dimensions of the pad being smaller than the operating wavelength of the photodiode, the first and second materials being transparent to the operating wavelength.

According to an embodiment, the first material has an index n1 different from index n2 of the second material, each of indexes n1 and n2 being smaller than or equal to index $n_{SC}$ of the semiconductor material forming the photodiode.

According to an embodiment, the photodiode is coated with a protection layer made of a material having an index n3 smaller than n1 and n2.

According to an embodiment, the light-receiving surface has lateral dimensions in the order of the operating wavelength, the photodiode being coated with a single pad.

According to an embodiment, the light-receiving surface has lateral dimensions in the order of a plurality of operating wavelengths, the photodiode being coated with a pad network with a pitch in the order of the operating wavelength of the photodiode.

According to an embodiment, the photodiode is of SPAD type.

According to an embodiment, the photodiode is formed based on silicon, and the pads are polysilicon pads surrounded with silicon nitride spacers.

An embodiment provides a method of manufacturing a photodiode comprising a prior simulation step to determine, according to the selected materials and to the operating wavelength, the dimensions and the pitch of the pads.

According to an embodiment, the steps of manufacturing the pads and the spacers are carried out at the same time as MOS transistor gate manufacturing steps.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION OF THE DRAWINGS

Figure 1:
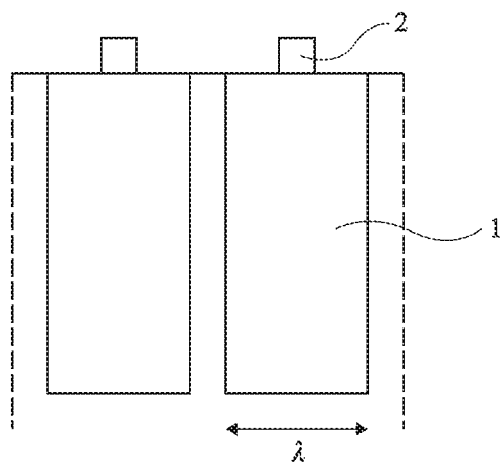
FIG. 1 very schematically shows, in cross-section view, a portion of two small photodiodes.

For clarity, the same elements have been designated with the same reference numerals in the various drawings and, further, as usual in the representation of integrated circuits, the various drawings are not to scale.

Figure 3:
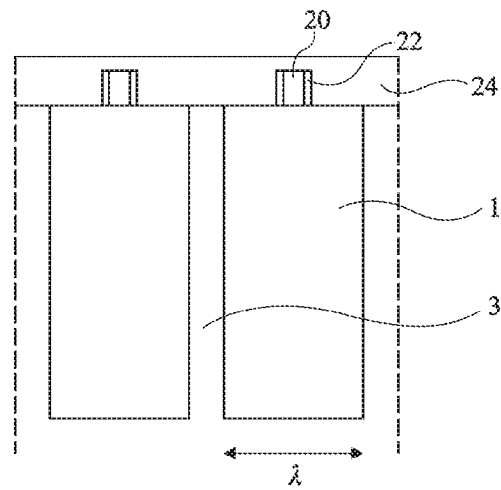
FIG. 3 shows, in cross-section view, an embodiment of pixels of photodiodes of small dimensions.

FIG. 3 shows an embodiment of two adjacent pixels, very schematically illustrated in the form of two regions 1 of a semiconductor material, for example, silicon, where photons are transformed into electron-hole pairs. Two neighboring semiconductor regions 1 are for example separated by an insulating region 3. Each semiconductor region is very schematically shown. In practice, each semiconductor region comprises, as previously indicated, junctions to store one of the carriers of each electron-hole pair, currently electrons. Here, as in FIG. 1, the case is considered where the lateral dimensions of the photodiode are of the same order of magnitude as the wavelength of the light that the photodiode is intended to capture, or operating wavelength of the photodiode.

On the upper surface of the photodiode are formed pads comprising a central pad 20 laterally coated with a layer 22. Layer 22 corresponds to what is currently called a spacer in MOS-transistor-on-semiconductor manufacturing. The entire upper structure is coated with an insulating layer 24 which is currently topped with a filtering layer and with a lens specific to each pixel (not shown). The central pad is made of a first material having an index n1 different from index n2 of the spacer material. Layer 24 is made of a material having an index n3 smaller than n1 and n2. The materials of central pad 20 and of layers 22 and 24 are transparent to the operating wavelength of the photodiode. Each of indexes n1 and n2 is smaller than index $n_{SC}$ of semiconductor material regions 1, but one of the two may however be equal to $n_{SC}$. As an example, in the case where semiconductor 1 is silicon and has a 850-nm operating wavelength, material 20 may be polysilicon of index n1=3.6 and material n2 may be silicon nitride, stoichiometric or not, SiN, of index n2=2. Pad 20 has lateral dimensions much smaller than the wavelength, for example, in the range between one tenth and one third of the wavelength, and lateral layer or spacer 22 has an average width in the range from 20 to 60 nm. This pad may have any shape, for example round, square, oval, or rectangular.

It can be observed, as will be discussed hereafter, that such a structure, properly sized, increases by a few percents the quantity of photon conversion into electron-hole pairs in semiconductor region 10. This is imputed to the fact that the presence of central pad 20, made of a material transparent to the considered light, generates, on the one hand, diffraction effects, such diffraction effects being enhanced by the presence of spacer 22 and/or, on the other hand, an antireflection effect which also improves with the presence of spacer 22. Instead of moving vertically in the semiconductor, some of the photons then move obliquely, which increases their probability of absorption.

Figure 2:
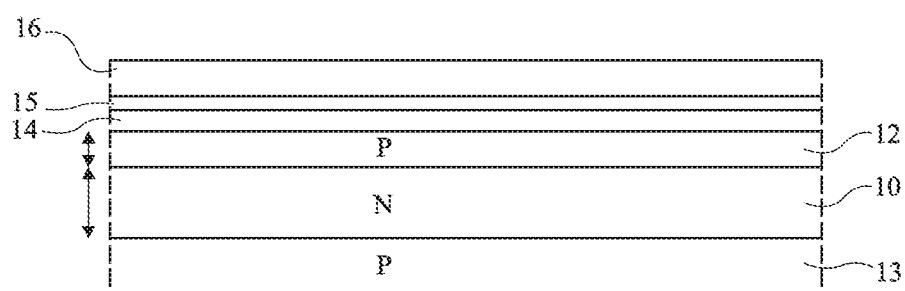
FIG. 2 very schematically shows, in cross-section view, a portion of a SPAD-type photodiode.
Figure 4A:
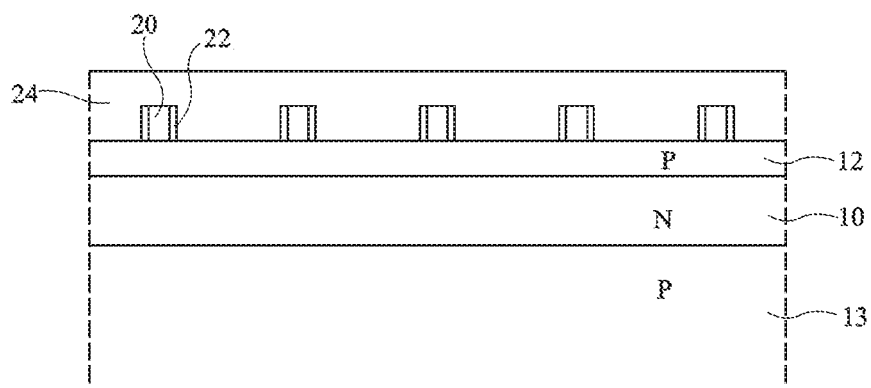
FIG. 4A shows, in cross-section view, an embodiment of a SPAD-type photodiode.

FIG. 4A is a cross-section view of a SPAD-type diode of the same type as in FIG. 2, comprising, like said diode, a layer 10 transforming photons into electron-hole pairs of a first conductivity type, for example, type N, surrounded by two layers 12 and 13 of the opposite conductivity type. The structure is covered with a network of pads, each of which comprises a central portion 20 surrounded with a spacer 22. The pads are of the same type as that described in relation with FIG. 3.

Figure 4B:
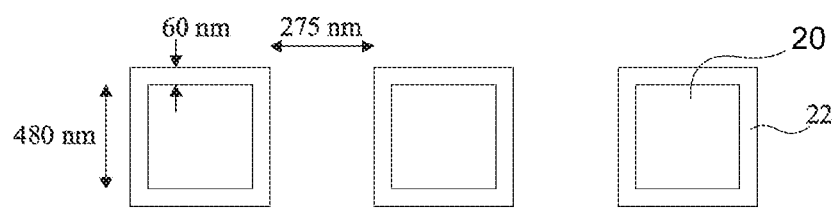
FIG. 4B is an enlarged top view of a portion of FIG. 4A.
Figure 4B:
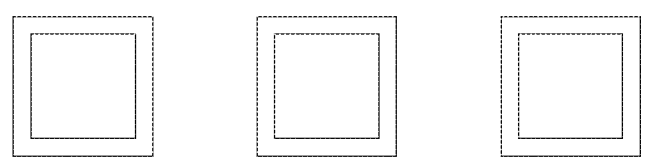
Figure 4B:
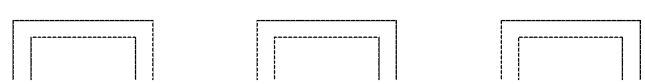

FIG. 4B is a top view of an embodiment. In the case where the semiconductor is silicon and where the radiation that the photodiode is intended to accept has a wavelength λ, the pitch between pads may be equal to 2λ/3 to within 20%, the lateral dimensions of the pads may be in the range from one tenth to one third of the wavelength and the distance between pads may be in the range from one quarter to two thirds of the wavelength. The pad thickness is preferably smaller than half the wavelength. In the shown example where the pads are made of polysilicon, the spacers are made of silicon nitride, and the operating wavelength is 850 nm, one may select, as an example:

lateral dimensions of the pads equal to 400 nm,
distances between pads equal to 150 nm,
spacer widths equal to 40 nm, and
pad and spacer widths equal to 180 nm.

Figure 5A:
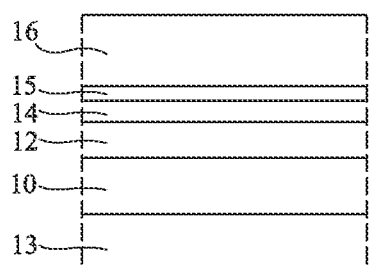
FIGS. 5A, 5B, and 5C are simplified cross-section views of a portion of the upper region of photodiodes of different types.
Figure 5B:
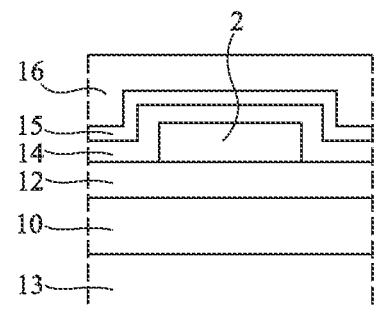
Figure 5C:
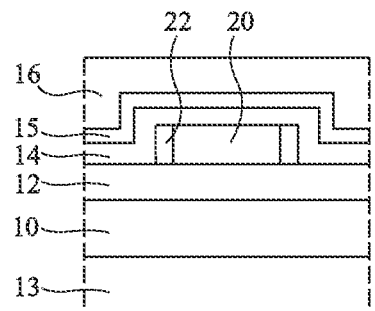

FIGS. 5A, 5B, 5C show, for comparison purposes, respectively, a pattern of a pad-less structure, of a structure with single-material pads, and of a structure with pads and spacers. In FIG. 5A, the structure is covered with no pad but with an antireflection layer only, said layer being designated with the same reference numerals as in FIG. 2. In FIG. 5B, the structure is coated with single-material pads 2 such as that in FIG. 1 and is provided with an antireflection coating. In FIG. 5C, the structure is provided with pads 20 surrounded with spacers 22 and is also provided with an antireflection coating.

Comparative measurements have been performed for each of the three structures of FIGS. 5A, 5B, and 5C in the framework of the above numerical example. The following table indicates, in each of the three cases, for a SPAD-type photodiode with periodic patterns, the photon absorption in % in layer 10 when layer 10 has a 1.5-μm thickness, the photon absorption in % in layer 12 when layer 12 has a 1-μm thickness, and the percentage of reflected light.

|  | PAD-LESS | WITH PADS | WITH PADS AND SPACERS |
| --- | --- | --- | --- |
| Absorption (Si = 1.5 μm) | 8 | 8.6 | 9.2 |
| Absorption (Si = 1 μm) | 5.7 | 6.3 | 6.7 |
| Reflection | 6.8 | 4.1 | 1.5 |

Similar results are obtained for a photodiode having lateral dimensions of the same order of magnitude as the operating wavelength, provided with a single pad.

Figure 6:
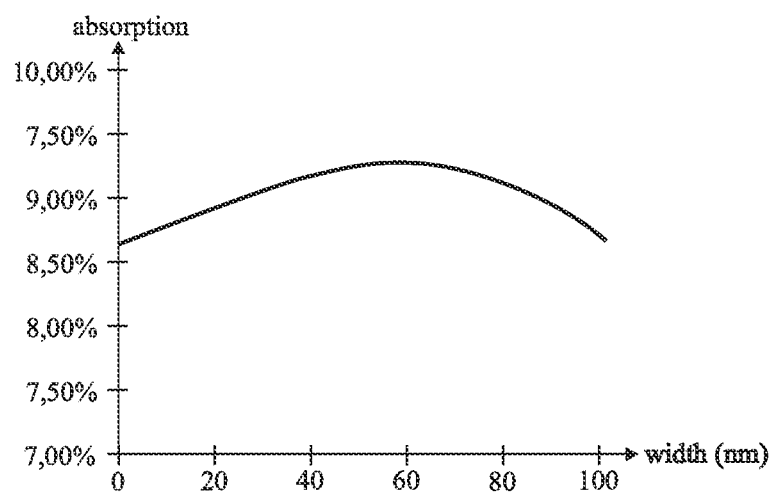
FIG. 6 is a curve showing the absorption of a photodiode of the type in FIGS. 4A and 4B or 5C according to the spacer width.

FIG. 6 is a curve illustrating the photon absorption in % in layer 10 for a photodiode provided with pads for various spacer width values. It can be seen that in the absence of spacers, such an absorption is in the order of 8.6% and that it increases up to a value greater than 9% for pad widths in the range from approximately 30 to approximately 90 nm, a maximum value being reached at approximately 9.3% for a spacer width in the order of 60 nm.

Figure 7:
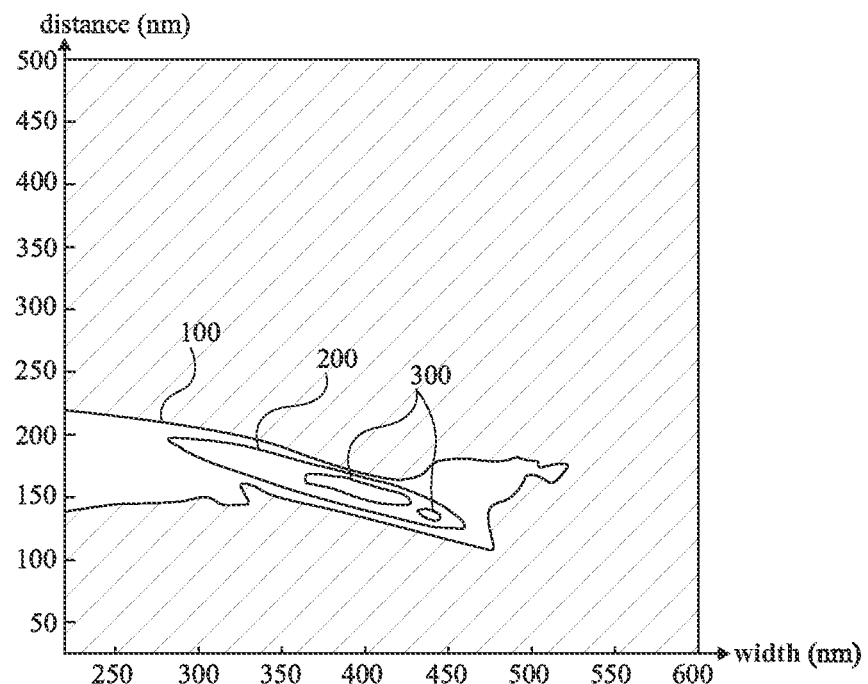
FIG. 7 shows the absorption gain in a photodiode of the type comprising pads and spacers, as compared with the case of a photodiode with pads and no spacers, for various values of parameters of pad width and distance between pads.

FIG. 7 shows that, according to the wavelength and to the various parameters of a structure, including the spacer width, the selection of the pad size and of the interval between pads is crucial to obtain the desired improvement of the photon absorption. The chart of FIG. 7 is plotted for spacers having a 40-nm width, for a 850-nm wavelength, for a silicon-based photodiode, and for polysilicon pads bordered with silicon nitride spacers. The abscissas indicate lateral pad dimensions and the ordinates indicate distances between pads. Curve 100 defines an area within which the absorption with pads and spacers is greater than the absorption with pads and no spacers. Curve 200 defines an area within which the absorption with spacers is greater by 4% than the absorption with no spacers. Curve 300 defines an area within which the absorption with spacers is greater by 6% than the absorption with no spacers. Thus, in this specific case, it can be seen that the absorption gain induced by spacers is maximum when the pad width ranges between approximately 350 and approximately 450 nm and when the space between pads is in the range from approximately 150 to approximately 180 nm.

Generally, it will be within the abilities of those skilled in the art to obtain the chart of FIG. 7 and to optimize the dimensions with conventional simulation methods, by using simulation programs such as software DiffractMOD (www.rsoftdesign.com) or software Grating Toolbox (www.lighttrans.com). Thus, provided to perform this previous simulation calculation, it will be within the abilities of those skilled in the art, with no trial and error, to form pads provided with spacers of suitable dimensions to increase the quantum efficiency or photon absorption of a photodiode.

Figure 8A:
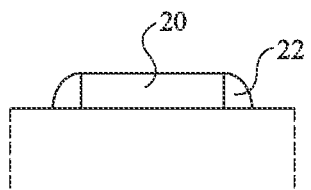
FIGS. 8A and 8B show examples of embodiments of pads arranged on photodiodes.
Figure 8B:
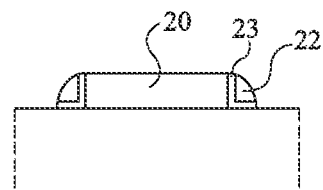

FIGS. 8A and 8B show practical examples of the forming of the previously-described pads provided with spacers. Indeed, it should be noted that a structure of photodiode type is generally associated, inside and on top of a same semiconductor substrate, with MOS transistors comprising gates having at least a portion made of polysilicon, such gates being provided with spacers, currently made of silicon nitride. Thus, as shown in FIG. 8A, a polysilicon pad 20 surrounded with silicon nitride spacers 22 may simply be used. According to a variation, illustrated in FIG. 8B, between a pad 20 and spacer 22 is provided a thin layer of intermediate material 23, as currently used in the forming of spacers for MOS transistors. As a result, the pads provided with spacers described herein may be manufactured without modifying a conventional technological photodiode and CMOS transistor manufacturing process.

It should also be noted that the pads according to the invention may be supported by a very thin insulator layer such as the gate insulator of MOS transistors, currently having a thickness in the order of a few nm only.

Of course, the present invention is likely to have various alterations, modifications, and improvements, especially as concerns the materials used, which may be any type of selected materials, provided for them to be transparent to the operating wavelength and to comply with the previously-discussed relations between indexes n1, n2, n3 and index $n_{SC}$ of the photodiode semiconductor. Should the technology lead to using other materials than polysilicon, silicon nitride, and silicon oxide, simulation programs such as those indicated previously will enable to determine the optimal dimensions of the pads and the network pitches to be used, with no trial and error.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A photosensor, comprising:
   a semiconductor substrate formed of a transparent material having a substrate optical index and having a photosensitive region with a light receiving surface;
   a plurality of pads formed of a transparent material having a first optical index smaller than or equal to the substrate optical index, said plurality of pads positioned over the photosensitive region;
   a spacer on the sidewall of each pad of the plurality of pads, said spacer formed of a transparent material having a second optical index smaller than or equal to the substrate optical index, wherein the spacers for the plurality of pads are separated from each other; and
   a protection layer over the light receiving surface and coating the plurality of pads and separated spacers, said protection layer formed of a transparent material having a third optical index less than both the first and second optical indices.

2. The photosensor of claim 1, wherein the light-receiving surface is divided into a plurality of light receiving areas, one area associated with a photodiode of said photosensitive region, and wherein a lateral dimension of each light receiving area is in the order of one operating wavelength.

3. The photosensor of claim 2, wherein each light receiving area includes a single pad of said plurality of pads.

4. The photosensor of claim 1, wherein the light-receiving surface includes a light receiving area associated with a photodiode of said photosensitive region, and wherein a lateral dimension of the light receiving area is in the order of a plurality of operating wavelengths.

5. The photosensor of claim 4, wherein said light receiving area includes multiple pads of said plurality of pads.

6. The photosensor of claim 5, wherein the plurality of pads are arranged in an array having a placement pitch.

7. The photosensor of claim 6, wherein the placement pitch is in the order of one operating wavelength of the photodiode.

8. The photosensor of claim 1, wherein the semiconductor substrate is formed of silicon, and wherein the pads are formed of polysilicon and wherein the spacers are formed of silicon nitride.

9. The photosensor of claim 1, wherein the protection layer is made of a material having a third optical index smaller than the first and second optical indices.

10. The photosensor of claim 1, wherein each pad of said plurality of pads is in direct contact with said light-receiving surface.

11. The photosensor of claim 1, wherein each pad of said plurality of pads is separated from said light-receiving surface by a distance which is less than 10 nm.

12. A photosensor, comprising:
   a semiconductor substrate having a substrate optical index and including a light receiving surface associated with a first photodiode and a second photodiode;
   a first pad formed of a transparent material having a first optical index smaller than or equal to the substrate optical index, said first pad positioned to at least partially cover said first photodiode;
   a second pad formed of said transparent material having the first optical index smaller than or equal to the substrate optical index, said second pad positioned to at least partially cover said second photodiode;
   a first sidewall spacer formed of a transparent material having a second optical index smaller than or equal to the substrate optical index, said first sidewall spacer positioned on a sidewall of said first pad;

a second sidewall spacer formed of said transparent material having the second optical index smaller than or equal to the substrate optical index, said second sidewall spacer positioned on a sidewall of said second pad;

wherein the first and second sidewall spacers are separated from each other; and an insulating layer formed of a transparent material having a third optical index less than the first and second optical indices, said insulating layer covering the first and second pads and first and second sidewall spacers.

13. A photosensor, comprising:

a semiconductor substrate having a substrate optical index and including a light receiving surface associated with a pinned photodiode;

a first pad formed of a transparent material having a first optical index smaller than or equal to the substrate optical index, said first pad positioned to partially cover said pinned photodiode;

a second pad formed of said transparent material having the first optical index smaller than or equal to the substrate optical index, said second pad positioned to partially cover said pinned photodiode;

a first sidewall spacer formed of a transparent material having a second optical index smaller than or equal to the substrate optical index, said first sidewall spacer positioned on a sidewall of said first pad;

a second sidewall spacer formed of said transparent material having the second optical index smaller than or equal to the substrate optical index, said second sidewall spacer positioned on a sidewall of said second pad;

wherein the first and second sidewall spacers are separated from each other; and an insulating layer formed of a transparent material having a third optical index less than the first and second optical indices, said insulating layer covering the first and second pads and first and second sidewall spacers.

* * * * *